(12) United States Patent
Wadhwa et al.

(10) Patent No.: US 10,503,196 B2
(45) Date of Patent: Dec. 10, 2019

(54) BIAS GENERATION AND DISTRIBUTION FOR A LARGE ARRAY OF SENSORS

(71) Applicant: QUALCOMM Incorporated, San Diego, CA (US)

(72) Inventors: Sameer Wadhwa, San Diego, CA (US); Yi Wang, San Diego, CA (US); Lennart Mathe, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/958,741

(22) Filed: Apr. 20, 2018

(65) Prior Publication Data

US 2019/0324489 A1    Oct. 24, 2019

(51) Int. Cl.
*G05F 1/10* (2006.01)
*G05F 3/02* (2006.01)
*G05F 3/26* (2006.01)
*G06F 3/041* (2006.01)
*G05F 3/24* (2006.01)

(52) U.S. Cl.
CPC ............. *G05F 3/262* (2013.01); *G05F 3/245* (2013.01); *G05F 3/247* (2013.01); *G06F 3/0416* (2013.01)

(58) Field of Classification Search
CPC .......... G05F 3/262; G05F 3/242; G05F 3/205; G05F 3/247; G05F 3/245
USPC .......................................... 327/543; 323/315
See application file for complete search history.

(56) References Cited

U.S. PATENT DOCUMENTS

| 6,563,295 | B2* | 5/2003 | Juang | G05F 3/245 323/315 |
| 7,034,598 | B2* | 4/2006 | Cho | G01R 31/2621 327/277 |
| 7,301,321 | B1* | 11/2007 | Uang | G05F 3/262 323/313 |
| 2004/0113681 | A1 | 6/2004 | Sugimura | |
| 2007/0146061 | A1* | 6/2007 | Iriarte | G05F 3/262 327/543 |
| 2007/0194837 | A1* | 8/2007 | Chiou | G05F 3/262 327/543 |
| 2017/0293314 | A1 | 10/2017 | Song et al. | |

FOREIGN PATENT DOCUMENTS

EP    0822477 A2    2/1998

OTHER PUBLICATIONS

International Search Report and Written Opinion—PCT/US2019/020476—ISA/EPO—dated May 10, 2019.

* cited by examiner

*Primary Examiner* — Anh Q Tra
(74) *Attorney, Agent, or Firm* — Qualcomm Incorporated

(57) ABSTRACT

In certain aspects, a bias generation circuit comprises a bias voltage generator. The bias voltage generator has a main NMOS transistor having a drain and a gate of the main NMOS transistor both coupled to a first terminal, a main resistor having a first main resistor terminal and a second main resistor terminal, wherein the first main resistor terminal couples to a source of the main NMOS transistor; and a main PMOS transistor having a source of the main PMOS transistor coupled to the second main resistor terminal and a drain and a gate of the main PMOS transistor both coupled to a second terminal, wherein the second terminal couples to a main ground. The bias generation circuit further comprises an array of sensors coupled to the first terminal and the second terminal.

21 Claims, 3 Drawing Sheets

BIAS GENERATION AND DISTRIBUTION FOR A LARGE ARRAY OF SENSORS

BACKGROUND

Field

Aspects of the present disclosure relate to bias generation and distribution, and more particularly, to bias generation and distribution for a large array of sensors that reduces bias distribution lines.

Background

Smartphones and tablets today come with a wealth of sensors to facilitate a better user experience, provide apps with enhanced information about the world around the phone, and provide robust and increased battery life. A smartphone or a tablet might integrate a MEMS microphone, an image sensor, an accelerometer, a gyroscope, an atmosphere pressure sensor, a digital compass, an optical proximity sensor, an ambient light sensor, a humidity sensor, touch sensors, and fingerprint sensors. A sensor is a device, module, or subsystem whose purpose is to detect events or changes in its environment and send the information to other electronics, frequently a processor. A good sensor should be sensitive to only the measured property, not the variation of the sensor itself, including sensing circuitry.

Most of the sensors require biasing the sensing circuitry at an appropriate voltage or current level. To have a good sensitivity, the bias voltage or current is often derived from a source with low variation, such as a bandgap reference. To support a large amount of sensors, a large number of interconnect lines are needed to distribute the bias current or voltage to the sensors from the low variation source, consuming a large amount of routing resources and taking valuable area in a smartphone or tablet. The problem is more severe for touch sensing or fingerprint sensing, which requires a large array of points, thus a large array of sensors. Accordingly, it would be beneficial to provide a bias generation and distribution scheme that reduces bias distribution lines yet provides reliable and stable bias current or voltage.

SUMMARY

The following presents a simplified summary of one or more implementations to provide a basic understanding of such implementations. This summary is not an extensive overview of all contemplated implementations, and is intended to neither identify key nor critical elements of all implementations nor delineate the scope of any or all implementations. The sole purpose of the summary is to present concepts relate to one or more implementations in a simplified form as a prelude to a more detailed description that is presented later.

In one aspect, a bias generation circuit comprises a bias voltage generator. The bias voltage generator has a main NMOS transistor having a drain and a gate of the main NMOS transistor both coupled to a first terminal, a main resistor having a first main resistor terminal and a second main resistor terminal, wherein the first main resistor terminal couples to a source of the main NMOS transistor; and a main PMOS transistor having a source of the main PMOS transistor coupled to the second main resistor terminal and a drain and a gate of the main PMOS transistor both coupled to a second terminal, wherein the second terminal couples to a main ground. The bias generation circuit further comprises an array of sensors coupled to the first terminal and the second terminal.

In another aspect, a method comprises providing a current source and generating a first bias voltage at a first terminal and a second bias voltage at a second terminal by a bias voltage generator having a main PMOS transistor, a main NMOS transistor, and a main resistor serially coupled. A drain and a gate of the main NMOS transistor both coupled to the first terminal. A first main resistor terminal of the main resistor couples to a source of the main NMOS transistor. A source of the main PMOS transistor couples to a second main resistor terminal of the main resistor and a drain and a gate of the main PMOS transistor both couple to the second terminal, wherein the second terminal couples to a main ground. The method further comprises mirroring a current of the current source to the bias voltage generator and coupling an array of sensors to the first bias voltage and the second bias voltage.

To accomplish the foregoing and related ends, one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the described implementations are intended to include all such aspects and their equivalents.

DETAILED DESCRIPTION

The detailed description set forth below, in connection with the appended drawings, is intended as a description of various aspects and is not intended to represent the only aspects in which the concepts described herein may be practiced. The detailed description includes specific details for the purpose of providing an understanding of the various concepts. However, it will be apparent to those skilled in the art that these concepts may be practiced without these specific details. In some instances, well-known structures and components are shown in block diagram form in order to avoid obscuring such concepts.

Sensors bring intelligence and awareness to the smartphones and tablets. Today's mobile devices are packed with many sensor systems that produce raw data on motion, location and the environment around us. The sensor circuitries often derive their bias currents or voltages from a low variation source, such as a bandgap reference. Some sensing system may require a large number of sensing points, thus a large array of sensors. For example, a fingerprint sensing system may comprise an array of 80×180 pixels, which requires 14,400 sensors. Generating and distributing bias currents or voltages to such a large array of sensors can be demanding.

Figure 1:
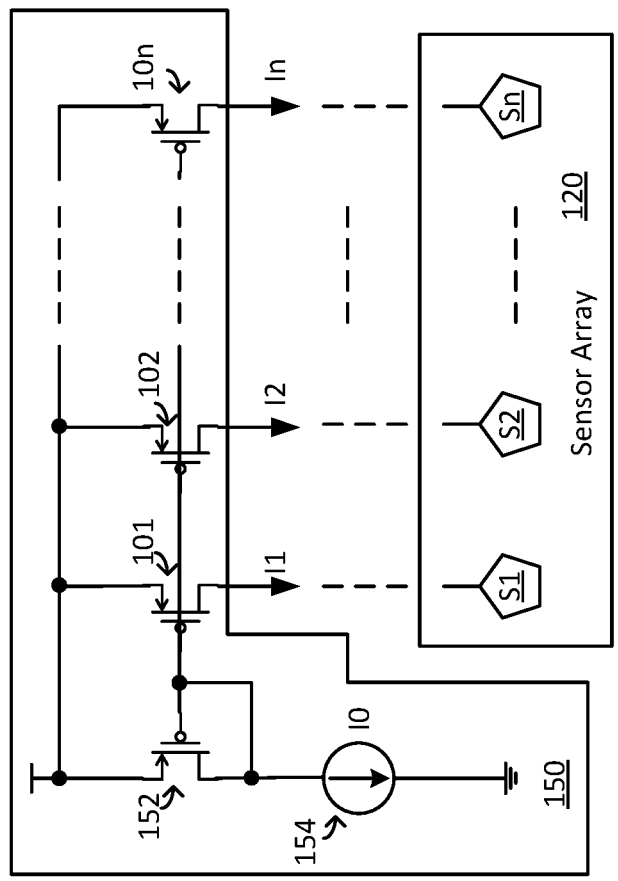
FIG. 1 illustrates an example bias current generation and distribution scheme for a large array of sensors according to certain aspects of the present disclosure.

FIG. 1 illustrate an example bias current generation and distribution scheme for a large array of sensors according to certain aspects of the present disclosure. The system 100 comprises a main bias generation circuit 150 and an array of sensing circuits 120. The main bias generation circuit 150 comprises a current source 154 with current I0. The current I0 is mirrored through a PMOS transistor 152 and an array of PMOS transistors 101, 102, . . . , 10n to generate n bias currents I1, I2, . . . , In. The bias currents I1, I2, . . . , In are routed through n interconnect lines to the array of sensing circuits 120, denoted as S1, S2, . . . , Sn. The number of interconnect lines n corresponds to the number of sensing circuits in the array of sensing circuits 120. For a fingerprint sensing system with 14,400 sensors, 14,400 interconnect lines are needed to distribute the bias current from the main bias generation circuit 150 to the array of sensing circuits 120. In addition, the array of sensing circuits 120 may be far away from the main bias generation circuit 150, resulting in supply voltage and ground variation between the main bias generation circuit 150 and the array of sensing circuits 120, causing variation in bias currents I1, I2, . . . , In.

Figure 2:
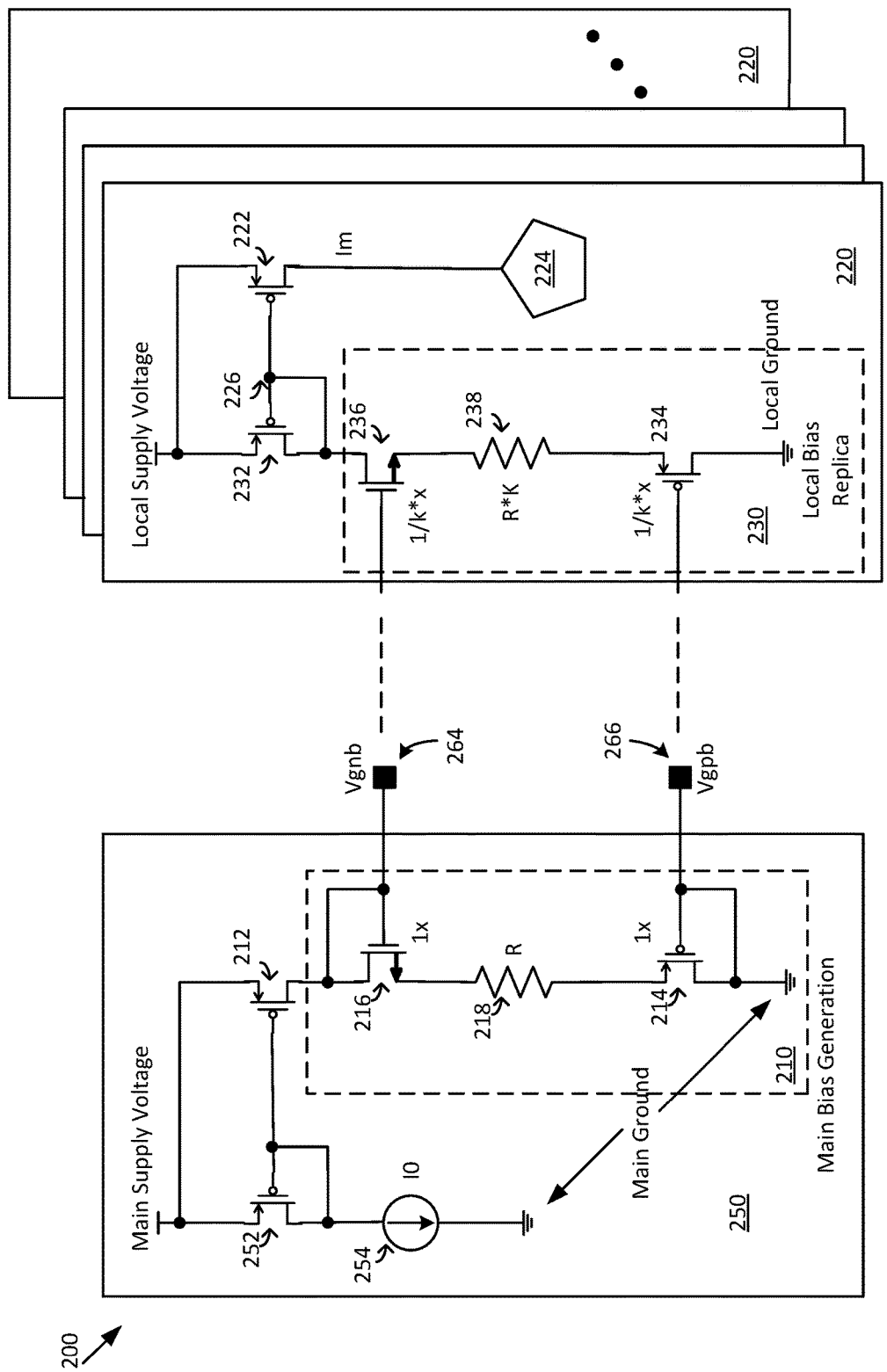
FIG. 2 illustrates an exemplary bias current generation and distribution scheme for a large array of sensors according to certain aspects of the present disclosure.

FIG. 2 illustrates an exemplary bias current generation and distribution scheme for a large array of sensors according to certain aspects of the present disclosure. The system 200 comprises a main bias generation circuit 250 and an array of sensors, each denoted as 220. Like the main bias generation circuit 150, the main bias generation circuit 250 also comprise a current source 254. The current source 254 may be a bandgap reference or other circuit.

Instead of generating n bias currents directly in the main bias generation circuit, the main bias generation circuit 250 comprises a bias voltage generator 210 having a main PMOS transistor 214, a main NMOS transistor 216, and a main resistor 218 to generate two bias voltages: an N bias voltage Vgnb at an N bias terminal 264 and a P bias voltage Vgpb at a P bias terminal 266. The main NMOS transistor 216, the main resistor 218, and the main PMOS transistor 214 are serially coupled. That is, the source of the main NMOS transistor 216 couples to a first main resistor terminal of the main resistor 218. A second main resistor terminal of the main resistor 218 couples to the source of the main PMOS transistor 214. The drain of the main PMOS transistor 214 couples to a main ground. The drain of the main NMOS transistor 216 couples to a current from a second main PMOS transistor 212. The N bias terminal 264 couples to the gate and drain of the main NMOS transistor 216. The P bias terminal 266 couples to the gate and drain of the main PMOS transistor 214.

The main bias generation circuit 250 also comprises a main current mirror formed by a pair of PMOS transistors 252 and 212 that mirrors a current from the current source 254 to the bias voltage generator 210. The current source 254, the main current mirror PMOS transistor pairs 252 and 212, and the bias voltage generator 210 may be closely placed and share the same main supply voltage and the main ground. The variation among them caused by main supply voltage or the main ground fluctuation is therefore low.

The system 200 further comprises an array of sensors 220. Each sensor 220 comprises a local bias replica 230. The local bias replica 230 couples to the N bias voltage Vgnb and the P bias voltage Vgpb and generates a local bias current. Like the bias voltage generator 210, the local bias replica 230 comprises a local PMOS transistor 234, a local NMOS transistor 236, and a local resistor 238. The local NMOS transistor 236, the local resistor 238, and the local PMOS transistor 234 are serially coupled. That is, the source of the local NMOS transistor 236 couples to a first local resistor terminal of the local resistor 238. A second local resistor terminal of the local resistor 238 couples to the source of the local PMOS transistor 234. The drain of the local PMOS transistor 234 couples to a local ground. The N bias terminal 264 couples to the gate of the local NMOS transistor 236 to provide the N bias voltage Vgnb to the local NMOS transistor 236. The P bias terminal 266 couples to the gate of the local PMOS transistor 234 to provide the P bias voltage Vgpb to the local PMOS transistor 234.

The local bias replica 230 reproduces a bias current, which is mirrored by a local current mirror formed by a pair of PMOS transistors 232 and 222. The local current mirror couples to the local bias replica 230 at the local bias terminal 226. The local bias terminal 226 couples to both gates of the pair of PMOS transistors 232 and 222. The local bias terminal 226 also couples to the drain of the local NMOS transistor 236. The mirrored current then provide bias to the sensing circuitry 224 in each sensor 220. The local current mirror PMOS transistor pair 232 and 222 couple to a local supply voltage.

The local supply voltage of each sensor 220 may electrically couples the main supply voltage. Likewise, the local ground voltage of each sensor 220 may electrically couples to the main ground. Ideally, when the local supply voltage of each sensor 220 is electrically coupled to the main supply voltage, their voltage level should be the same during operation. Similarly, when the local ground of each sensor 220 is electrically coupled to the main ground, their voltage level should be the same during operation. However, the array of sensors 220 may be far away from the main bias generation circuit 250. For example, the main bias generation circuit 250 may be at the periphery of the array of sensors 220. For a large array of sensors, such as a touch sensor system or a fingerprint sensor system, the main bias generation circuit 250 may be far away from some sensing circuits in the array of sensors 220. Due to IR drop, power glitch, and/or power fluctuation, the voltage level of the main supply voltage and the local supply voltage or the main ground and the local ground may not be always the same.

Nevertheless, the currents flowing through the bias voltage generator 210 or the local bias replica 230 are substantially independent of ground or supply voltage gradient or fluctuation across the array of sensors 220 due to their differential bias structures. Their currents are mainly determined by voltages across the main resistor 218 and the local resistor 238, respectively. The currents thus are less subject to the variation of the supply voltage or ground.

The main resistor 218 and the local resistor 238 are placed in respective bias voltage generator 210 and local bias replica 230 to degenerate the differential bias devices. For example, the main resistor 218 degenerates the main differential transistors, the main NMOS transistor 216 and the main PMOS transistor 214. The local resistor 238 degenerates the local different transistors, the local NMOS transistor 236 and the local PMOS transistor 234. The use of the degeneration resistors, the main resistor 218 and the local resistor 238, mitigates transistor mismatch, supply voltage gradient or fluctuation, and/or ground voltage gradient or fluctuation.

The resistance of the local resistor 238 for each local bias replica 230 may be optimized to improve the mismatch, to reduce the power consumption, and/or to save area. Similarly, the sizes of the transistors, the local NMOS transistor 236 and the local PMOS transistor 234, for each local bias replica 230 may be optimized to improve the mismatch, to reduce the power consumption, and/or to save area. The resistance values of the local resistor 238 and the main resistor 218 may be sized differently. For example, the resistance of the local resistor 238 may be sized to be k times the resistance of the main resistor 218, where k is a positive number. Correspondingly, the current flowing through the local resistor 238 is sized to be substantially (within process, temperature, voltage, and/or other variation) 1/k times the current flowing through the main resistor 218. Accordingly, the channel width and channel length ratio (W/L) of the local NMOS transistor 236 is sized to be substantially (within process, temperature, voltage, and/or other variation) 1/k times the channel width and channel length ratio (W/L) of the main NMOS transistor 216, and the channel width and the channel length ratio (W/L) of the local PMOS transistor 234 is sized to be substantially (within process, temperature, voltage, and/or other variation) 1/k times the channel width and channel length ratio (W/L) of the main PMOS transistor 214. Generally, for better process matching, the channel lengths of the PMOS transistors 214 and 234 would be selected to be the same, so are the channel lengths of the NMOS transistors 216 and 236. The channel width and channel length ratio (W/L), therefore, is mainly determined by the channel widths. That is, when the channel lengths are the same, the channel width of the main NMOS transistor 216 is sized to be k times the channel width of the local NMOS transistor 236; and the channel width of the main PMOS transistor 214 is sized to be k times the channel width of the local PMOS transistor 234. By sizing the device sizes for local bias replica 230 differently from the bias voltage generator 210, the mismatch is improved, the power consumption is decreased, and the overall area for the local bias replica 230 is reduced. The value of k may be smaller or greater than 1. A typically value of k may be around 10.

Each local bias replica 230 or each local current mirror of each sensor in the array of sensors 220 may have same structure. The transistor and resistor sizes in each local bias replica 230 and local current mirror may be the same or may be different. For example, for each sensing circuit in a fingerprint sensor system, one may choose same design, including same device sizes, for each local bias replica and local current mirror. However, the device sizes for a local bias replica 230 designed for a touch sensing system may be different from the device sizes for a local bias replica 230 designed for a fingerprint sensing system.

As illustrated in FIG. 2, only 2 interconnect lines, one for the N bias voltage and one for the P bias voltage, are needed to distribute the bias signal to the array of sensors 220, regardless of the number of sensors in the array of sensors 220. Significant resource saving is thus achieved.

Figure 3:
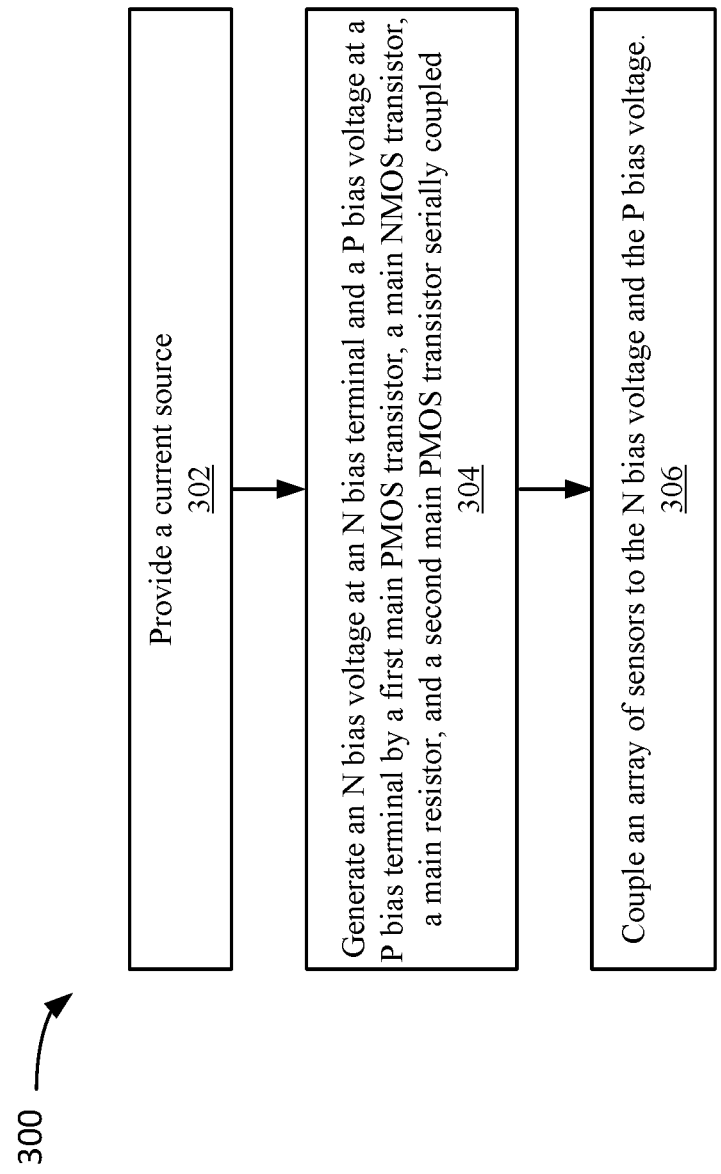
FIG. 3 illustrates an exemplary bias generation and distribution method according to certain aspects of the present disclosure.

FIG. 3 illustrates an exemplary bias generation and distribution method according to certain aspects of the present disclosure. At 302, a current source (e.g., the current source 154 or 254) is provide. The current source may be a bandgap reference or other circuit.

At 304, an N bias voltage and a P bias voltage is generated by a bias voltage generator (e.g., the bias voltage generator 210). The bias voltage generator comprises a main NMOS transistor, a main resistor, and a main PMOS transistor that are serially coupled. A main current mirror may be needed to couple the current source to the bias voltage generator. The N bias voltage may be provided at an N bias terminal, and the P bias voltage may be provided at a P bias terminal. A drain and a gate of the main NMOS transistor both couple to the N bias terminal. A first main resistor terminal couples to a source of the main NMOS transistor, and a second main resistor terminal couples to a source of the main PMOS transistor. A drain and a gate of the main PMOS transistor both couple to the P bias terminal. The P bias terminal couples to a main ground.

At 306, the N bias voltage and the P bias voltage couple to an array of sensors (e.g., the array of sensors 220) to generate a bias current by a local bias replica (e.g., the local bias replica 230) in each sensor of the array of sensors. Each local bias replica couples to the N bias terminal and the P bias terminal. Each local bias replica comprises a local NMOS transistor, a local resistor, and a local PMOS transistor coupled serially. A drain of the local NMOS transistor couples to the local bias terminal. A first local resistor terminal of the local resistor couples to a source of the local NMOS transistor, and a second local resistor terminal of the local resistor couples to a source of the local PMOS transistor. A gate of the local PMOS transistor couples to the P bias terminal, and a drain of the local PMOS transistor couples to a local ground. A gate of the local NMOS transistor couples to the N bias terminal.

Each sensor of the array of sensors further comprises a local current mirror mirroring a current of the local bias replica and providing a bias current to a sensing circuit in the corresponding sensor of the array of sensors. The local current mirror couples to the local bias replica through the drain of the local NMOS transistor.

The local ground and the main ground may be electrically coupled through a ground interconnect. Likewise, the local supply voltage and the main supply voltage may be electrically couples through a supply voltage interconnect.

The local NMOS transistor, the local PMOS transistor, and the local resistor may be optimally sized to improve the mismatch, power consumption, and/or chip area. The local resistor has a resistance value that is about k time as a resistance value of the main resistor, wherein k may be any positive number. A good number could be around 10. Corresponding to the resistance value ratio of the local resistor and the main resistor, the main NMOS transistor may have a same channel length as the local NMOS transistor but the main NMOS transistor has a width that is substantially (within process, temperature, voltage, and/or other variation) k times a width of the local NMOS transistor, and the main PMOS transistor may have a same channel length as the local PMOS transistor but the main PMOS transistor has a width that is substantially (within process, temperature, voltage, and/or other variation) k times a width of the local PMOS transistor.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:
1. A bias generation circuit, comprising:
    a bias voltage generator, including:
        a main NMOS transistor having a drain and a gate of the main NMOS transistor both coupled to a first terminal;
        a main resistor having a first main resistor terminal and a second main resistor terminal, wherein the first main resistor terminal couples to a source of the main NMOS transistor; and a main PMOS transistor having a source of the main PMOS transistor coupled to the second main resistor terminal and a drain and a gate of the main PMOS transistor both coupled to a second terminal, wherein the second terminal couples to a main ground; and an array of sensors coupled to the first terminal and the second terminal, wherein each sensor of the array of sensors comprises a local bias replica coupled to the first terminal and the second terminal, and wherein the local bias replica comprises:

a local NMOS transistor having a gate of the local NMOS transistor coupled to the first terminal;

a local resistor having a first local resistor terminal and a second local resistor terminal, wherein the first local resistor terminal couples to a source of the local NMOS transistor; and a local PMOS transistor having a source of the local PMOS transistor coupled to the second local resistor terminal, a gate of the local PMOS transistor coupled to the second terminal, and a drain of the local PMOS transistor coupled to a local ground.

2. The bias generation circuit of claim 1, wherein the bias voltage generator is configured to generate a first bias voltage at the first terminal and a second bias voltage at the second terminal.

3. The bias generation circuit of claim 1 further comprising a main current mirror coupled to the bias voltage generator, wherein the main current mirror comprises a second main PMOS transistor mirroring a current from a current source, wherein the second main PMOS transistor is configured to have a source of the second main PMOS transistor coupled to a main supply voltage, a gate of the second main PMOS transistor coupled to the current source, and a drain of the second main PMOS transistor coupled to the first terminal.

4. The bias generation circuit of claim 1, wherein each sensor of the array of sensors further comprises a local current mirror mirroring a current of the local bias replica.

5. The bias generation circuit of claim 4, wherein the local current mirror is configured to provide a bias current to a sensing circuit.

6. The bias generation circuit of claim 4, wherein the local current mirror comprises a second local PMOS transistor having a source of the second local PMOS transistor coupled to a local supply voltage and a gate and a drain of the second local PMOS transistor both coupled to a drain of the local NMOS transistor.

7. The bias generation circuit of claim 1, wherein the local ground and the main ground are configured to be electrically coupled through a ground interconnect.

8. The bias generation circuit of claim 1, wherein the local resistor has a resistance value that is about k time a resistance value of the main resistor, wherein k is a positive number.

9. The bias generation circuit of claim 8, wherein the local NMOS transistor and the local PMOS transistor are sized to mirror a current that is substantially 1/k times a current flowing through the bias voltage generator.

10. The bias generation circuit of claim 9, wherein the main NMOS transistor has a same channel length as the local NMOS transistor and wherein the main NMOS transistor has a width that is substantially k times a width of the local NMOS transistor.

11. The bias generation circuit of claim 9, wherein the main PMOS transistor has a same channel length as the local PMOS transistor and wherein the main PMOS transistor has a width that is substantially k times a width of the local PMOS transistor.

12. The bias generation circuit of claim 1, wherein the local bias replica for each sensor of the array of sensors is substantially the same.

13. The bias generation circuit of claim 1, wherein the array of sensors is an array of fingerprint sensors or touch sensors.

14. The bias generation circuit of claim 1, wherein the bias voltage generator is at a periphery of the array of sensors.

15. A method, comprising:
providing a current source;
generating a first bias voltage at a first terminal and a second bias voltage at a second terminal by a bias voltage generator having a main PMOS transistor, a main NMOS transistor, and a main resistor serially coupled, wherein
a drain and a gate of the main NMOS transistor both coupled to the first terminal;
a first main resistor terminal of the main resistor couples to a source of the main NMOS transistor; and
a source of the main PMOS coupled to a second main resistor terminal of the main resistor and a drain and a gate of the main PMOS transistor both coupled to the second terminal, wherein the second terminal couples to a main ground;
mirroring a current of the current source to the bias voltage generator; and
coupling an array of sensors to the first bias voltage and the second bias voltage, wherein each sensor of the array of sensors comprises a local bias replica coupled to the first terminal and the second terminal, and wherein the local bias replica comprises:
a local NMOS transistor having a gate of the local NMOS transistor coupled to the first terminal;
a local resistor having a first local resistor terminal and a second local resistor terminal, wherein the first local resistor terminal couples to a source of the local NMOS transistor; and
a local PMOS transistor having a source of the local PMOS transistor coupled to the second local resistor terminal, a gate of the local PMOS transistor coupled to the second terminal, and a drain of the local PMOS transistor coupled to a local ground.

16. The method of claim 15, wherein the local ground and the main ground are configured to be electrically coupled through a ground interconnect.

17. The method of claim 15, wherein the local resistor has a resistance value that is k time a resistance value of the main resistor, wherein k is a positive number.

18. The method of claim 17, wherein the main NMOS transistor has a same channel length as the local NMOS transistor and wherein the main NMOS transistor has a width that is substantially k times a width of the local NMOS transistor.

19. The method of claim 15, wherein each sensor of the array of sensors further comprises a local current mirror mirroring a current of the local bias replica.

20. The method of claim 19, wherein the local current mirror is configured to provide a bias current to a sensing circuit.

21. The method of claim 15, wherein the array of sensors is an array of fingerprint sensors or touch sensors.

* * * * *